United States Patent
Lamarche

(10) Patent No.: US 8,962,989 B2
(45) Date of Patent: Feb. 24, 2015

(54) FLEXIBLE HERMETIC SEMICONDUCTOR SOLAR CELL PACKAGE WITH NON-HERMETIC OPTION

(75) Inventor: Paul F. Lamarche, Morgan Hill, CA (US)

(73) Assignee: Solar Junction Corporation, San Jose, CA (US)

(*) Notice: Subject to any disclaimer, the term of this patent is extended or adjusted under 35 U.S.C. 154(b) by 14 days.

(21) Appl. No.: 13/224,232

(22) Filed: Sep. 1, 2011

(65) Prior Publication Data

US 2012/0199196 A1    Aug. 9, 2012

Related U.S. Application Data

(60) Provisional application No. 61/439,095, filed on Feb. 3, 2011, provisional application No. 61/439,082, filed on Feb. 3, 2011.

(51) Int. Cl.
| | |
|---|---|
| *H01L 31/00* | (2006.01) |
| *H01L 31/042* | (2014.01) |
| *H02N 6/00* | (2006.01) |
| *H01L 31/02* | (2006.01) |
| *H01L 31/052* | (2014.01) |

(52) U.S. Cl.
CPC ........ *H01L 31/02008* (2013.01); *H01L 31/052* (2013.01); *Y02E 10/50* (2013.01)
USPC ............................ 136/259; 136/246; 136/251

(58) Field of Classification Search
CPC ........................ H01L 31/02008; H01L 31/052
USPC .......................................... 136/259, 246, 251
See application file for complete search history.

(56) References Cited

U.S. PATENT DOCUMENTS

| | | | |
|---|---|---|---|
| 3,903,427 A | | 9/1975 | Pack |
| 4,062,698 A | | 12/1977 | Blakeslee et al. |
| 4,180,414 A | | 12/1979 | Diamond et al. |
| 4,209,347 A | * | 6/1980 | Klein ............................ 136/246 |
| 4,491,681 A | | 1/1985 | Kirpich |
| 4,830,678 A | * | 5/1989 | Todorof et al. ............... 136/259 |
| 4,999,060 A | * | 3/1991 | Szekely et al. ............... 136/259 |
| 5,118,361 A | | 6/1992 | Fraas et al. |

(Continued)

FOREIGN PATENT DOCUMENTS

| | | |
|---|---|---|
| EP | 2254156 A2 | 11/2010 |
| WO | 2011/137305 | 11/2011 |

(Continued)

OTHER PUBLICATIONS

"C10100 Oxygen-Free Copper", Anchor Bronze & Metals, Inc., accessed at <https://web.archive.org/web/20080727020042/http://www.anchorbronze.com/c10100.htm> and dated Jul. 27, 2008.*

(Continued)

*Primary Examiner* — Jonathan Johnson
*Assistant Examiner* — Angelo Trivisonno
(74) *Attorney, Agent, or Firm* — Kenneth Allen; William R. Lambert; Kilpatrick Townsend & Stockton LLP

(57) ABSTRACT

A device containing a solar cell chip that may include a hermetically sealed chamber containing optical matching fluid and a threaded pedestal mounting to allow for replacement of solar cell units and that are easily mountable to a master heat sink.

7 Claims, 7 Drawing Sheets

(56) References Cited

U.S. PATENT DOCUMENTS

| | | | |
|---|---|---|---|
| 5,460,659 A | 10/1995 | Krut | |
| 5,500,052 A | 3/1996 | Horiuchi et al. | |
| 5,935,345 A | 8/1999 | Kuznicki | |
| 5,944,913 A | 8/1999 | Hou et al. | |
| 6,281,426 B1 | 8/2001 | Olson et al. | |
| 6,623,283 B1 | 9/2003 | Torigian et al. | |
| 6,663,982 B1* | 12/2003 | Stephens et al. | 428/621 |
| 7,449,630 B2 | 11/2008 | Ho et al. | |
| 7,514,782 B2 | 4/2009 | Hiramatsu et al. | |
| 7,727,795 B2 | 6/2010 | Stan et al. | |
| 7,851,693 B2 | 12/2010 | Fork et al. | |
| 2003/0029497 A1 | 2/2003 | Tanaka | |
| 2004/0119149 A1 | 6/2004 | Yin Pang et al. | |
| 2005/0072457 A1* | 4/2005 | Glenn | 136/246 |
| 2005/0155641 A1 | 7/2005 | Fafard | |
| 2006/0162768 A1 | 7/2006 | Wanlass et al. | |
| 2006/0163596 A1 | 7/2006 | Kim et al. | |
| 2006/0185716 A1 | 8/2006 | Murozono et al. | |
| 2006/0240599 A1 | 10/2006 | Amano et al. | |
| 2007/0089774 A1 | 4/2007 | Lasich | |
| 2007/0090517 A1 | 4/2007 | Moon et al. | |
| 2007/0240760 A1* | 10/2007 | Gronet | 136/259 |
| 2007/0241450 A1 | 10/2007 | Hiramatsu et al. | |
| 2007/0290287 A1 | 12/2007 | Freedman | |
| 2008/0105298 A1* | 5/2008 | Lu et al. | 136/256 |
| 2008/0150064 A1 | 6/2008 | Zimmerman et al. | |
| 2008/0185040 A1* | 8/2008 | Tom et al. | 136/259 |
| 2008/0190480 A1 | 8/2008 | Joshi | |
| 2008/0315398 A1 | 12/2008 | Lo et al. | |
| 2009/0086478 A1 | 4/2009 | Sanroma et al. | |
| 2009/0120500 A1 | 5/2009 | Prather et al. | |
| 2009/0159126 A1* | 6/2009 | Chan | 136/259 |
| 2009/0229659 A1 | 9/2009 | Wanlass et al. | |
| 2009/0255575 A1 | 10/2009 | Tischler | |
| 2009/0266395 A1 | 10/2009 | Murthy et al. | |
| 2009/0272438 A1 | 11/2009 | Cornfeld | |
| 2009/0298218 A1 | 12/2009 | Federici et al. | |
| 2010/0037935 A1 | 2/2010 | Vaid et al. | |
| 2010/0051085 A1 | 3/2010 | Weidman et al. | |
| 2010/0132765 A1 | 6/2010 | Cumpston et al. | |
| 2010/0139752 A1 | 6/2010 | Fang | |
| 2010/0180936 A1 | 7/2010 | Kim | |
| 2010/0294362 A1* | 11/2010 | Christ et al. | 136/259 |
| 2010/0313954 A1 | 12/2010 | Seel et al. | |
| 2010/0326429 A1 | 12/2010 | Cumpston et al. | |
| 2010/0326492 A1 | 12/2010 | Tan et al. | |
| 2011/0030764 A1* | 2/2011 | Seo et al. | 136/246 |
| 2011/0048535 A1* | 3/2011 | Nagyvary et al. | 136/259 |
| 2011/0108113 A1* | 5/2011 | Arikawa | 136/259 |
| 2011/0265871 A1 | 11/2011 | Lamarche | |
| 2012/0025618 A1 | 2/2012 | Erickson, Jr. et al. | |
| 2012/0199194 A1 | 8/2012 | Lamarche et al. | |
| 2012/0199195 A1 | 8/2012 | Lamarche | |

FOREIGN PATENT DOCUMENTS

| | | |
|---|---|---|
| WO | 2011/106165 | 8/2012 |
| WO | 2012/106160 | 8/2012 |

OTHER PUBLICATIONS

International Search Report and Written Opinion corresponding to the PCT application No. PCT/US2011/034485, date of mailing Aug. 3, 2011, 9 pages total.

International Search Report and Written Opinion of the International Searching Authority for PCT Application No. PCT/US2012/022539, mailed on May 23, 2012, 10 pages.

International Search Report and Written Opinion of the International Searching Authority for PCT Application No. PCT/US2012/022611, mailed on Jun. 21, 2012, 9 pages.

Non-Final Office Action mailed on Dec. 19, 2012, for U.S. Appl. No. 13/224,204, 14 pages.

Non-Final Office Action mailed on Mar. 14, 2013, for U.S. Appl. No. 13/092,555, 12 pages.

Non-Final Office Action mailed on Nov. 21, 2013, for U.S. Appl. No. 12/944,361, 11 pages.

Non-Final Office Action mailed on Dec. 11, 2013, for U.S. Appl. No. 13/092,555, 12 pages.

Non-Final Office Action mailed on Dec. 19, 2012, for U.S. Appl. No. 13/224,204, 10 pages.

Non-Final Office Action mailed on Mar. 14, 2013, for U.S. Appl. No. 13/224,204, 16 pages.

Non-Final Office Action mailed on Dec. 20, 2013, for U.S. Appl. No. 13/224,181, 10 pages.

International Preliminary Report on Patentability corresponding to the PCT Application No. PCT/US2011/034485, mailed on Nov. 15, 2012, 7 pages.

International Search Report and Written Opinion corresponding to PCT Application No. PCT/US2011/036486, mailed on Aug. 25, 2011, 12 pages.

International Search Report and Written Opinion corresponding to PCT Application No. PCT/US2010/056800, mailed on Jan. 26, 2011, 8 pages.

Cotal et al., "III-V multijunction solar cells for concentrating photovoltaics", Energy and Environment Science, Dec. 10, 2008, pp. 174-192.

Friedman et al., "Breakeven Criteria for the GaInNAs Junction in GaInP/GaAs/GaInNAs/Ge Four-junction Solar Cells", Progress in Photovoltaics: Research and Applications, 2002, pp. 331-344.

Garcia et al., "Analysis of Tellurium As N-Type Dopant in GaInP: Doping, Diffustion, Memory Effect and Surfactant Properties", Journal of Crystal Growth 298 2007, pp. 794-799.

Geelen et al., "Epitaxial Lift-Off GaAs Solar Cell From a Reusable GaAs Substrate", Materials Science and Engineering B45, 1997, pp. 162-171.

Green, "Do Built-in Fields Improve Solar Cell Performance?", Progress in Photovoltaics: Research and Applications, 2009, pp. 57-66.

Jackrel et al., "Dilute nitride GaInNAs and GaInNAsSb solar cells by molecular beam epitaxy", Journal of Applied Physics 101, 114916, 2007, pp. 1-8.

Janotti et. al., "Mutual Passivation of Electrically Active and Isovalent Impurities in Dilute Nitrides", Physical Review Letters 100, 2008, 045505.

Ng et al., "1EV GANXAS1-X-YSBY Material for Lattice-Matched III-V Solar Cell Implementation on GAAS and GE", Photovoltaic Specialists Conference (PVSC), 2009, 34$^{th}$ IEEE, pp. 76-80.

Ptak et al., "Low-acceptor-Concentration GaInNAs grown by Molecular-beam Epitaxy for High-current p-i-n. solar cell applications", Journal of Applied Physics 98, 2005, 094501.

Volz et al., "Optimization of Annealing Conditions of (GaIn)(NAs) for Solar Cell Applications", Journal of Crystal Growth 310, 2008, pp. 2222-2228.

Wu et al., "Band Anticrossing in Highly Mismatched III-V Semiconductor Alloys", Semiconductor Science and Technology 17, 2002, pp. 860-869.

Yamaguchi et al., "Multi-junction III-V solar cells: Current status and future potential", Solar Energy, Jul. 2005, vol. 79, Issue 1, Abstract only.

Yu et. al., "Mutual Passivation of Group IV Donors and Nitrogen in Diluted GaNxAs1-x Alloys", Applied Physics Letters, vol. 83, No. 14, Oct. 6, 2003, pp. 2844-2846.

Notice of Allowance mailed on Jul. 8, 2014, for U.S. Appl. No. 13/224,204, 10 pages.

Final Office Action mailed on Aug. 1, 2014 for U.S. Appl. No. 13/092,555, 13 pages.

Final Office Action mailed on Jul. 31, 2013 for U.S. Appl. No. 13/224,181, 14 pages.

* cited by examiner

FLEXIBLE HERMETIC SEMICONDUCTOR SOLAR CELL PACKAGE WITH NON-HERMETIC OPTION

CROSS-REFERENCES TO RELATED APPLICATIONS

This application was filed contemporaneously with U.S. Provisional Patent Application No. 61/439,095, filed on Feb. 3, 2011, entitled "FLEXIBLE HERMETIC SEMICONDUCTOR SOLAR CELL PACKAGE WITH NON-HERMETIC OPTION" and U.S. Provisional Application No. 61/439,082, filed on Feb. 3, 2011, entitled "INTEGRATED SEMICONDUCTOR SOLAR CELL PACKAGE," the contents of which are incorporated herein by reference in their entirety.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to packaging for semiconductor photovoltaic devices known generally as solar cells.

Photovoltaic devices present unique problems requiring specialized packaging to achieve desired levels of durability, mechanical integrity, electrical connectivity, maximum thermal transfer, and convenience of mounting. The packaging must also lend itself to a low cost and highly automated manufacturing process. The delicate semiconductor material used as the operative portion of a solar cell must be protected from excessive current by attaching, for example, an additional device such as a bypass diode in parallel with the anode and cathode of the device, an operation normally accomplished by soldering surface mount plastic packaged devices in a manner that may cause high rates of mechanical failure in actual usage. Further, suppliers of photovoltaic cells and systems are increasingly required to guarantee that their products will operate without replacement for long periods of time, in some cases up to 30 years or more. The packaging for such cells must therefore provide durability as well as reliability.

Current solar cell package designs suffer from design and component limitations that restrict package usage. For example, solar cell packaging to date has relied on ceramics such as aluminum nitride (ALN) and berrylium oxide (BeO) to provide thermally conductive substrates between the heat sink and solar cell. Because of the limited number of suppliers, use of these ceramic substrates increases the cost of manufacturing the solar packaging. Commercialized solar packages also require that the chip, thermally conductive substrates, and heat sink be stacked vertically, increasing the profile of the package and thereby making hermetic sealing of the solar package more difficult and expensive. A further limitation of solar packaging designs in current use is a maximum platform size of 4.5 inches×4.5 inches. An increased platform size would reduce the raw materials input required at the front end of the manufacturing process, ultimately increasing the capacity throughput.

SUMMARY

According to the invention, a solar cell package is provided having a circular base and a ceramic ring that together form an individual sealed compartment to contain a solar cell, bypass diodes and other components required for a particular installation, which is preferably hermetically sealed, the entire structure being interchangeable and replaceable. In a specific embodiment the base has a separate and distinct support structure forming an individual sealed chamber containing the solar cell chip itself and optionally the bypass diodes and other components. Alternatively the bypass diodes and other components may be outside the hermetically sealed chamber. To achieve proper hermetic sealing of the solar cell chip, a cover is provided that has a clear window centrally located directly above the chip and hermetically sealed to the cover plate at its periphery by the ceramic ring in the chamber, the ring also being raised to define a reservoir to contain optical index matching fluid within the chamber and against the window. In still another embodiment, the hermetic cover and glass are omitted and replaced with a hermetic conformal coating that seals the components from the environment. Yet another embodiment does not employ hermetic sealing but takes advantage of some of the other unique features of the invention. A threaded mount is provided that allows for interchange and replacement of the package.

The invention will be better understood by reference to the following detailed description in connection with the accompanying drawings.

DETAILED DESCRIPTION OF THE INVENTION

Figure 1:
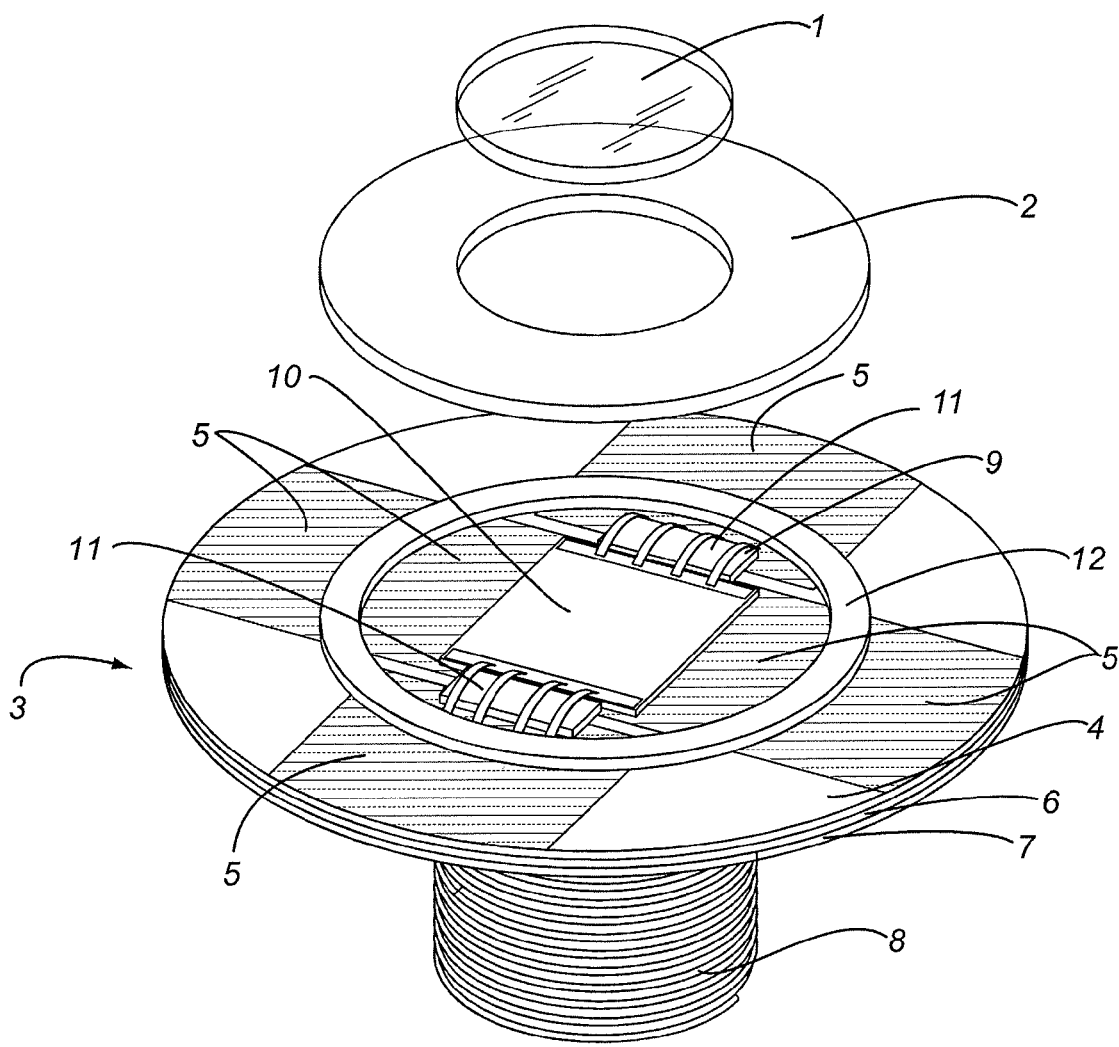
FIG. 1 is an assembly view of a first embodiments of the invention.

The embodiment of FIG. 1 is a solar cell package with a glass window 1, metal cover 2, a circular base 3 comprising three layers 4, 6 and 7, and a ceramic ring 12 within which a solar cell chip 10 and flip chip bypass diodes 11 are disposed and wherein the solar cell 10 and bypass diodes 11 are sealed in an hermetic environment. The transparent window 1 is a nonpermeable lens that is hermetically attached to a metal cover 2. The hermetically sealed chamber serves as a reservoir to contain optical index matching fluid between the window 1 and the chip 10. To allow for repetitive cycles of thermal expansion and contraction, the coefficients of thermal expansion ("CTE") of the cover 2 and the glass 1 must be selected to minimize any movement between the two as the exterior package expands and contracts with temperature. The window material must be selected to transmit as effectively as possible the full spectrum of sunlight to which it may be exposed. In the embodiment shown, quartz glass is used as the window material and Kovar™ as the material for the metal cover, but those skilled in the art will recognize that many other materials would perform equally well.

The circular base 3 in this embodiment comprises three layers selected to provide good thermal conductivity and appropriately compatible CTEs. The upper layer 4 is a nonconductive surface onto which conductors, also called traces, 5 are deployed. In this embodiment, aluminum nitride is used as the nonconductor and an alloy of gold and silver iss used as the conductors, but those skilled in the art would readily recognize that other materials are available to achieve the same result. The middle layer 6 of the circular base 3 in the embodiment of FIG. 1 is made of molybdenum, and the lower layer 7 is made of oxygen-free, high-conductivity copper, where both are selected for their high thermal and electrical conductivity and their comparable CTEs. The thickness of the various layers in the base may vary, but in the embodiment of FIG. 1 thickness is approximately 0.040". The size and configuration of the base may also vary as needed for a particular application.

A threaded tubular pedestal aka threaded screw attachment 8, having a substantially flat upper surface, is brazed to the lower layer 7 of the circular base in good thermal contact for maximum heat transfer to a master heat sink (not shown). The screw attachment 8 allows for ease of manufacture of solar cell arrays that contain many such solar cell assemblies and also for ease of replacement of any cells that fail prematurely. Use of a threaded attachment mechanism also increases the surface area in contact with the master heat sink. Persons skilled in the art will recognize that there exist many alternative ways of attaching a solar cell package to a master heat sink for enhanced heat transfer and other purposes.

On the electrically nonconductive upper surface of the circular base, a deposited layer of conductive traces 5, a silver and gold alloy in this embodiment, is patterned to allow for electrical connections through wire bonding ribbons 9 for the output of solar cell 10. Solar cell 10 may be of many different types that are useful with CPV. In the embodiment of FIG. 1, the solar cell is formed of materials found in Columns III and V of the Periodic Table (so-called "III-V cells"), but persons skilled in the art will recognize the applicability of the inventions claimed herein to cells made of other materials. The wire bonding ribbons 9 may be made of gold, as in the embodiment described, or some other highly conductive material. The conductive traces 5 may be patterned to allow for a bias connection. In the embodiment of FIG. 1, the conductive traces 5 may also be patterned to allow for the connection of bypass diodes 11, configured as "flip chip" designs, through direct contact between the traces 5 and the poles (anode or cathode) of the diodes. Those skilled in the art will recognize that there exist many other ways to make such connections. The embodiment shown employs anode and cathode contacts on the lower face of the diodes to contact the traces directly.

Bonded to the nonconductive upper layer of the circular base, and forming a hermetic seal thereto, is an annular ring 12 creating a compartment containing the solar cell and bypass diodes, along with their various electrical connections. In the embodiment shown, the annular ring 12 is made of aluminum oxide, but those skilled in the art will recognize that other materials could be used with equal effectiveness. The upper surface of the annular ring is prepared and mounted to form an hermetic seal with metal cover 2.

Figure 2:
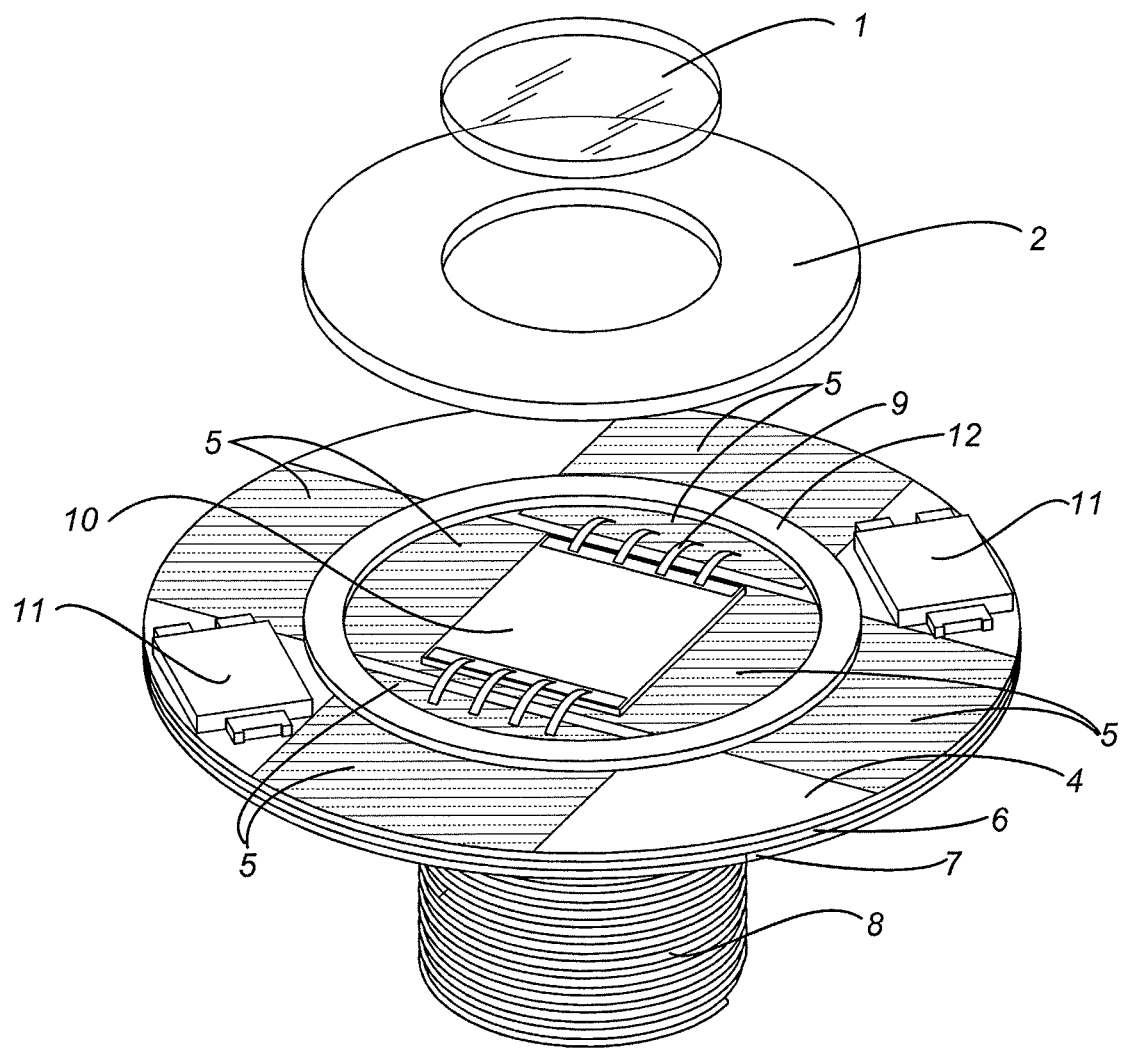
FIG. 2 is an assembly view of another embodiment of the invention, similar to the first, but with packaged bypass diodes located externally to the sealed hermetic environment.

A further embodiment is shown in FIG. 2. In this embodiment, the bypass diodes 11 are not mounted as in FIG. 1, but instead are pre-packaged bypass diodes 11 mounted outside the ceramic support structure 2 and span between the metal traces 5 that connect to the anode and cathode of solar cell 10 outside the support structure 2. This arrangement allows replacement of the bypass diodes 11 without breaking the hermetic seals previously created.

Figure 3:
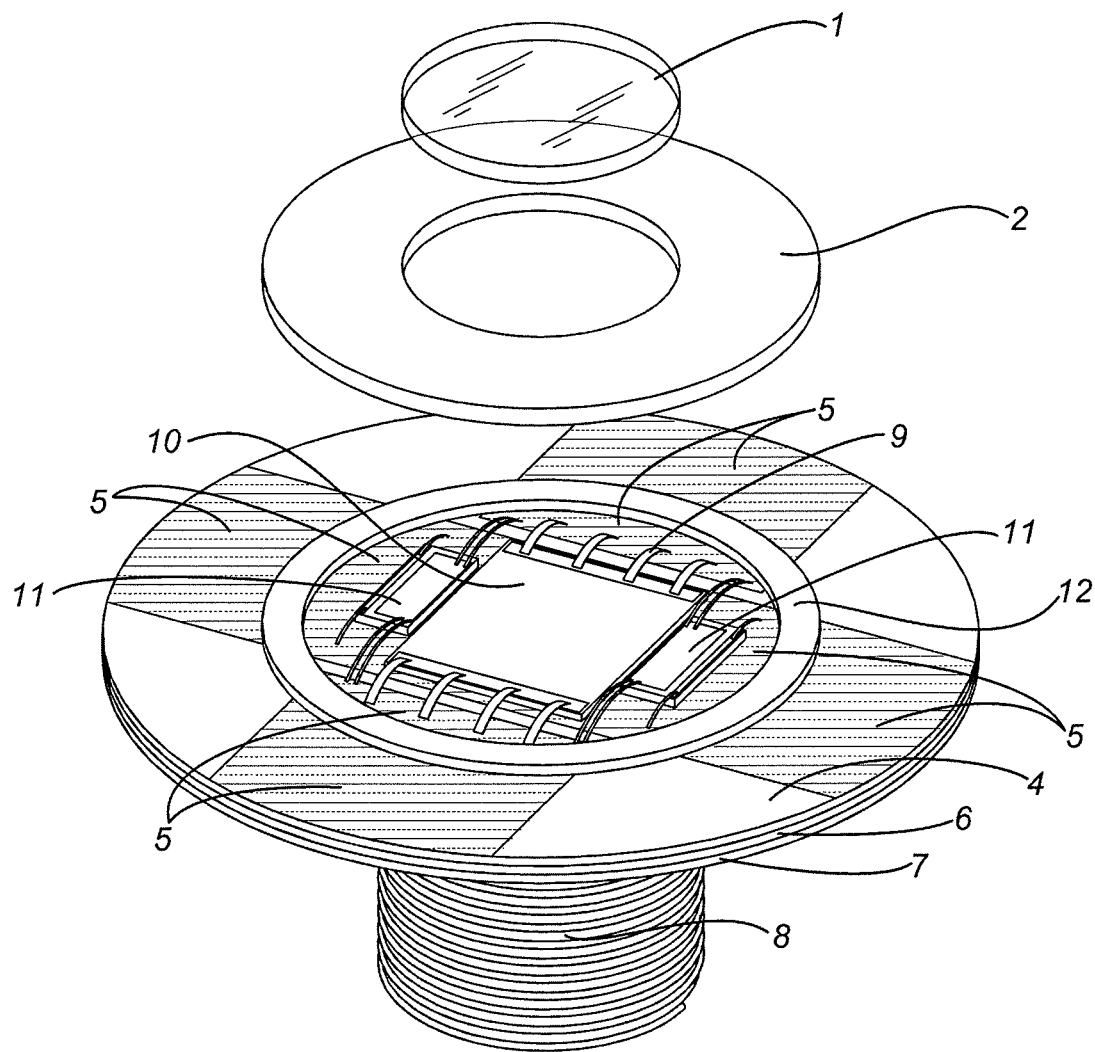
FIG. 3 is an assembly view of still another embodiment of the invention, similar to the first but having the bypass diodes wired to appropriate bond pads within the alumina ring to form a complete circuit.

FIG. 3 shows a still further embodiment of the invention, similar in most respects to the embodiment of FIG. 1, wherein the bypass diodes 11 are contained within the hermetically sealed compartment but which employ wire or ribbon bonding 9 to connect the anode and cathode of the chip 10 to the conductive traces 5.

Figure 4:
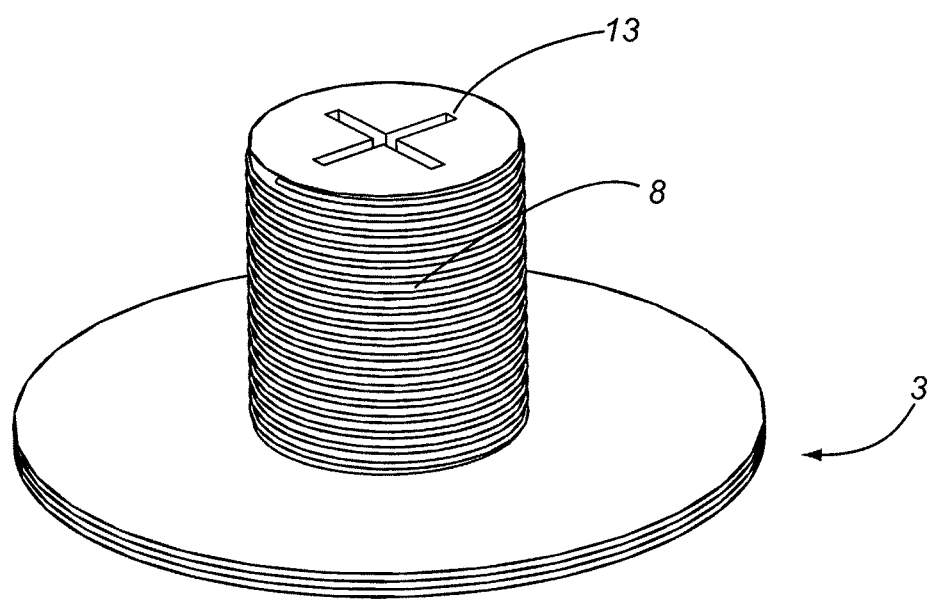
FIG. 4 is a diagram showing a design feature of the invention wherein the back side of the circular base is bonded to a threaded screw attachment capable of being easily added to or removed from a structural array of solar cells, the screw attachments having a screw slot feature for ease of assembly with a master heat sink.

FIG. 4 illustrates a detail of one embodiment of the threaded screw attachment shown as 8 in FIG. 1. The threaded attachment allows easy and quick attachment to a master heat sink of any size having matching threads. It will also allow easy replacement. A Phillips Head screw slot 13 is shown that will enable easy placement and removal of the part, as needed. Those skilled in the art will recognize that this detail is merely one of many ways of connecting a solar cell to a heat sink and is not intended to limit the scope of what is claimed.

Figure 5:
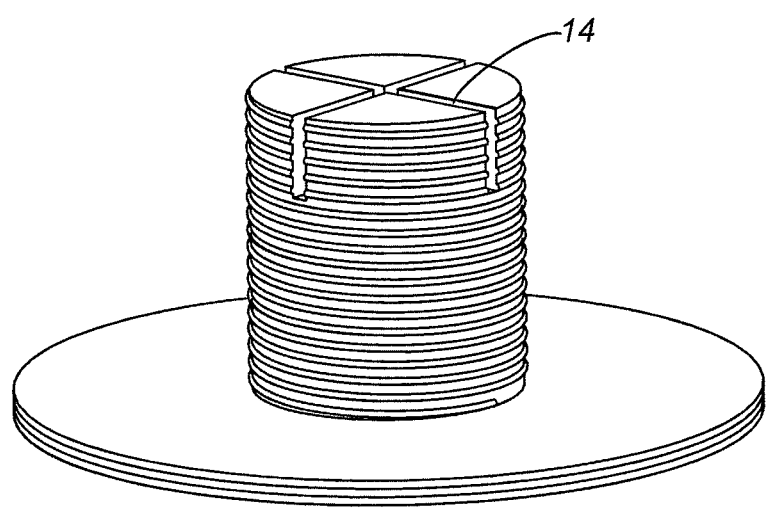
FIG. 5 is a diagram showing an alternative detail of the screw attachment having a "spline" slot in the screw base.

FIG. 5 illustrates still another detail of a threaded screw attachment 8 by which the packaged solar cell may be attached to a master heat sink. In the embodiment of FIG. 5, the threaded attachment 8 is configured with a slot or "spline" 14. This feature gives the user the option of attaching a nut after the part is securely screwed into the master heat sink. By using such a spline, attaching and tightening the nut will cause a slight flare in the threads that will increase the tension between the threads and the wall of the heat sink to form a stronger bond.

Figure 6A:
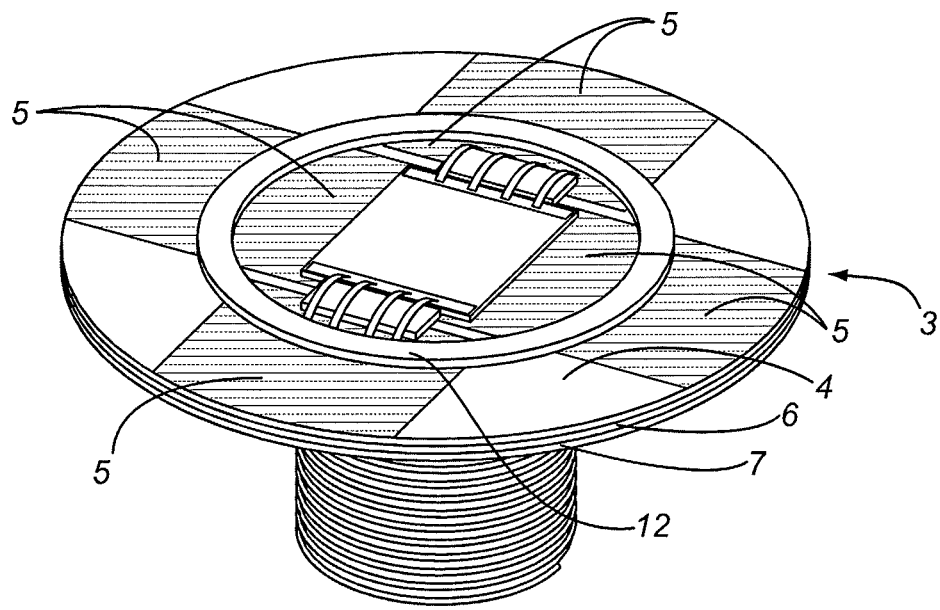
FIG. 6A is a diagram showing a non-hermetic layout that includes a solar cell chip and two flip chip bypass diodes wherein the ceramic ring can function as a "well" that contains optical matching material selected to match the spectral response of the solar cell.
Figure 6B:
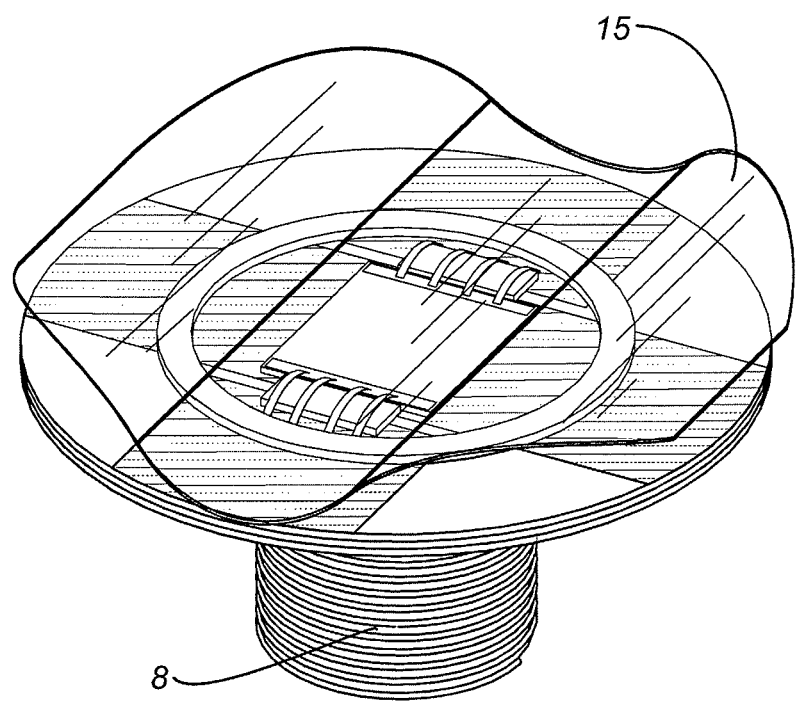
FIG. 6B is a diagram showing use of a conformal coating to create the hermetic seal wherein the ceramic ring can be used by the customer as a container for optical matching material.

FIG. 6A and FIG. 6B illustrate two embodiments of the invention that do not employ the use of a metal cover and quartz window. FIG. 6A is an embodiment of the invention that is not hermetically sealed. Such an arrangement might be suitable, for example, in an installation where other forms of protection from moisture are available, as for example, where the entire array is mounted inside a glass enclosure where weather exposure is not an issue. There are numerous ways to implement the non-hermetically sealed embodiment of FIGS. 6A and 6B. A circular base 3 is provided in three layers, all of which are thermally conductive and serve to transfer heat to the master heat sink. The lower two layers 6, 7 are electrically conductive and the upper layer 4 is a nonconductive material onto which traces have been deposited. Aluminum nitride can be used as the nonconductor layer 4 of the circular base. The conductive layers 6 and 7 may be made of molybdenum and OFHC copper or equivalent materials selected for good heat transfer characteristics and CTE compatibility. In the embodiment of FIGS. 6A and 6B, these layers can be on the order of 0.04" in thickness, although this dimension may vary with the requirements of the application. In this embodiment, the circular layout may be made in almost any size or shape needed for integration with other components. Deposited on the upper surface of the nonconductive layer 4 are the traces 5 that can connect to the anode and cathode, respectively, of the solar cell chip, the bypass diodes and any bias source that may be needed. As previously noted, there are numerous ways in which the various electrical components can be placed and the various connections made. The bypass diodes can be connected to the traces directly or with wire bonding or a combination of the two. A ceramic ring 12 in the nonhermetically sealed embodiment can be is used as a containment chamber or "well" for an optical matching material designated by custom designs. The ceramic ring 12 may be bonded to the circular base using epoxy or other adhesive that provides necessary durability to endure years of use.

FIG. 7B shows an embodiment of the invention in which hermetic sealing is achieved by the use of a conformal coating 15. Although conformal coatings have been available in the past, conventional coatings have generally been permeable to moisture to and thus in effective as true hermetic seals required by the standards in use today. See, e.g., Mil Spec 883. The conformal coating preferred for use is the alkali silicate compound known as Alkali Silicate Glass, a product that is available from Rockwell Collins under license. The material is disclosed in at least the following patent applications: U.S. 2009/0068474 A1. In this embodiment, the components of the base are similar to those of other embodiments, with an upper layer 4 of aluminum nitride, a middle layer 6 of molybdenum and a lower layer 7 of OFHC copper that is bonded to a screw attachment 8 of Kovar (also known as ASTM F-15, NILO K, Pernifer 2918, Rodar, and Dilvar P1. Kovar alloy is a controlled expansion alloy of 29% nickel and 17% cobalt with the remaining balance being iron.), Similar metals with good heat transfer, matched expansion and high strength characteristics are suitable. The electrical components, the solar cell chip and by pass diodes are contained within a ceramic ring that may be made of alumina and connected electrically to the conductive traces deposited on the nonconductive layer of the base by either by wire ribbon bonding or direct connection. Once all of the components are in place, the conformal coating is spray-applied at room temperature to create hermetic sealing, and cured at an elevated temperature. The thickness of the conformal coating 15 will be determined by the manufacturer's specification and may vary from one application to another from a minimum of 40 nm, depending on the lifespan and durability of the coating desired.

Figure 7:
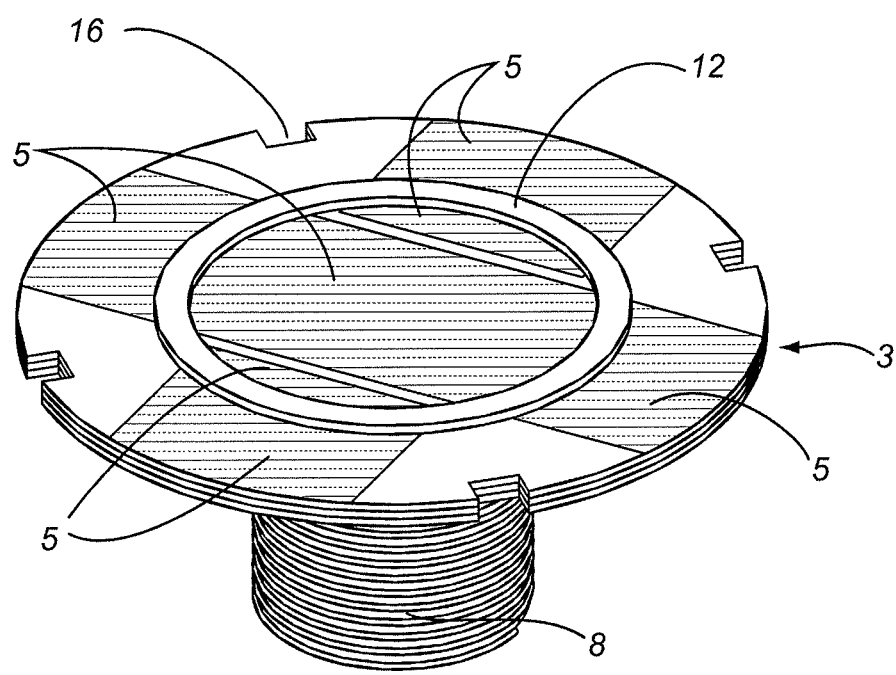
FIG. 7 is a diagram showing a configuration of the invention in which slots are cut into the circular base to allow a customized tool to insert, tighten and remove the cell from master heat sink or other structure with which it might be used.

FIG. 7 shows the placement of tool slots 16 in the perimeter of the circular support structure 3 to facilitate the use of a custom wrench that can be used for tightening the screw attachment into the master heat sink (not shown) to increase the strength of the bond and the heat transfer. The ring 12 defines the boundaries of the sealed region.

The invention has been explained with reference to specific embodiments. Other embodiments will be evident to those of ordinary skill in the art. Therefore, it is not intended that this invention be limited, except as indicated by the appended claims.

What is claimed is:

1. A low profile photovoltaic package, comprising
a circular base, comprising:
an upper layer comprising aluminum nitride, a middle layer comprising molybdenum, and a lower layer comprising oxygen-free, high-conductivity copper, wherein the upper layer, the middle layer, and the lower layer are characterized by a high and comparable coefficient of thermal expansion;
the upper layer is electrically nonconductive;
the middle layer and the lower layer are electrically conductive; and
electrically conductive traces on a top surface of the upper layer;
an annular ceramic ring hermetically sealed to the top surface with an epoxy or with an adhesive, wherein the annular ceramic ring is configured to form a compartment;
a photovoltaic device mounted to the circular base within the compartment and electrically interconnected to the electrically conductive traces;
bypass diodes mounted to the circular base, wherein the bypass diodes are interconnected to the photovoltaic device and to the electrically conductive traces;
an externally threaded pedestal fixedly attached to a bottom surface of the lower layer;
a cover, wherein the cover comprises:
a quartz window comprising an outer diameter; and
an iron-nickel-cobalt alloy disk characterized by a low thermal expansion coefficient and comprising an inner diameter.

2. The low profile photovoltaic package of claim 1, wherein the annular ceramic ring comprises aluminum oxide.

3. The low profile photovoltaic package of claim 1, wherein the circular base is characterized by a thickness of about 0.040 inches.

4. The low profile photovoltaic package of claim 1, wherein the electrically conductive traces comprise an alloy of gold and silver.

5. The low profile photovoltaic package of claim 1, wherein the threaded pedestal comprises exterior threads.

6. The low profile photovoltaic package of claim 1, wherein the hermetically sealed compartment is filled with an optical index matching fluid.

7. The low profile photovoltaic package of claim 1, wherein the bypass diodes are mounted to the circular base within the compartment.

* * * * *